(12) United States Patent
Lee et al.

(10) Patent No.: US 7,800,139 B2
(45) Date of Patent: Sep. 21, 2010

(54) THIN FILM TRANSISTOR AND METHOD FOR FABRICATING THE SAME, AND LIQUID CRYSTAL DISPLAY DEVICE AND METHOD FOR MANUFACTURING THE SAME

(75) Inventors: Bo Hyun Lee, Gyeonggi-do (KR); Tae Hyoung Moon, Gyeonggi-do (KR); Jae Hyun Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 173 days.

(21) Appl. No.: 12/005,319

(22) Filed: Dec. 27, 2007

(65) Prior Publication Data

US 2008/0265293 A1 Oct. 30, 2008

(30) Foreign Application Priority Data

Apr. 25, 2007 (KR) .................. 10-2007-040309

(51) Int. Cl.
*H01L 27/13* (2006.01)
(52) U.S. Cl. .............................. 257/213; 257/E27.113; 438/479
(58) Field of Classification Search .............. 977/963, 977/883
See application file for complete search history.

(56) References Cited

U.S. PATENT DOCUMENTS

| | | | | |
|---|---|---|---|---|
| 2003/0178075 A1* | 9/2003 | Moon et al. | .................. | 137/833 |
| 2005/0276981 A1* | 12/2005 | Ong et al. | ................. | 428/411.1 |
| 2006/0061267 A1* | 3/2006 | Yamasaki et al. | ........... | 313/504 |
| 2006/0283535 A1* | 12/2006 | Jeong | ........................... | 156/60 |
| 2007/0197044 A1* | 8/2007 | Jacobson et al. | ............. | 438/758 |
| 2007/0222933 A1* | 9/2007 | Ohmi | ......................... | 349/138 |

OTHER PUBLICATIONS

X. Duan et al., Nature 425, 2003 274.*
S. Lee et al., Chem. Phys. Lett. 427, 2006 107.*

* cited by examiner

*Primary Examiner*—Thanh V Pham
*Assistant Examiner*—Mark A Laurenzi, III
(74) *Attorney, Agent, or Firm*—Morgan, Lewis & Bockius LLP

(57) ABSTRACT

A thin film transistor (TFT) including a nanowire semiconductor layer having nanowires aligned in one direction in a channel region is disclosed. The nanowire semiconductor layer is selectively formed in the channel region. A method for fabricating the TFT, a liquid crystal display (LCD) device using the TFT, and a method for manufacturing the LCD device are also disclosed. The TFT fabricating method includes forming alignment electrodes on the insulating film such that the alignment electrodes face each other, to define a channel region, forming an organic film, to expose the channel region, coating a nanowire-dispersed solution on an entire surface of a substrate including the organic film, forming a nanowire semiconductor layer in the channel region by generating an electric field between the alignment electrodes such that nanowires of the nanowire semiconductor layer are aligned in a direction, and removing the organic film.

9 Claims, 18 Drawing Sheets

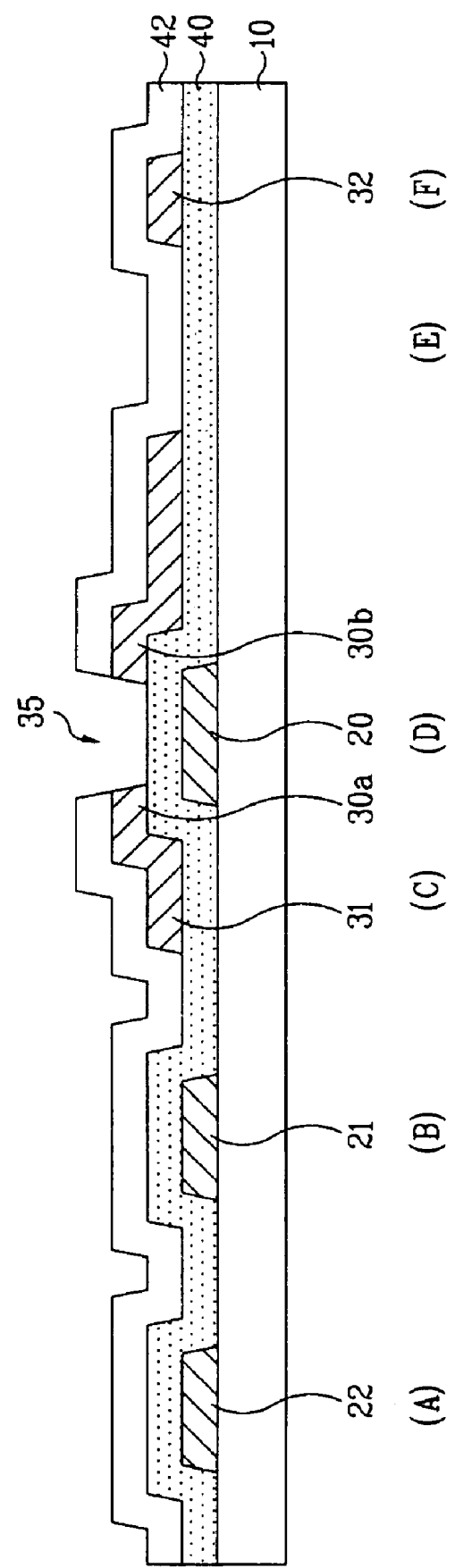

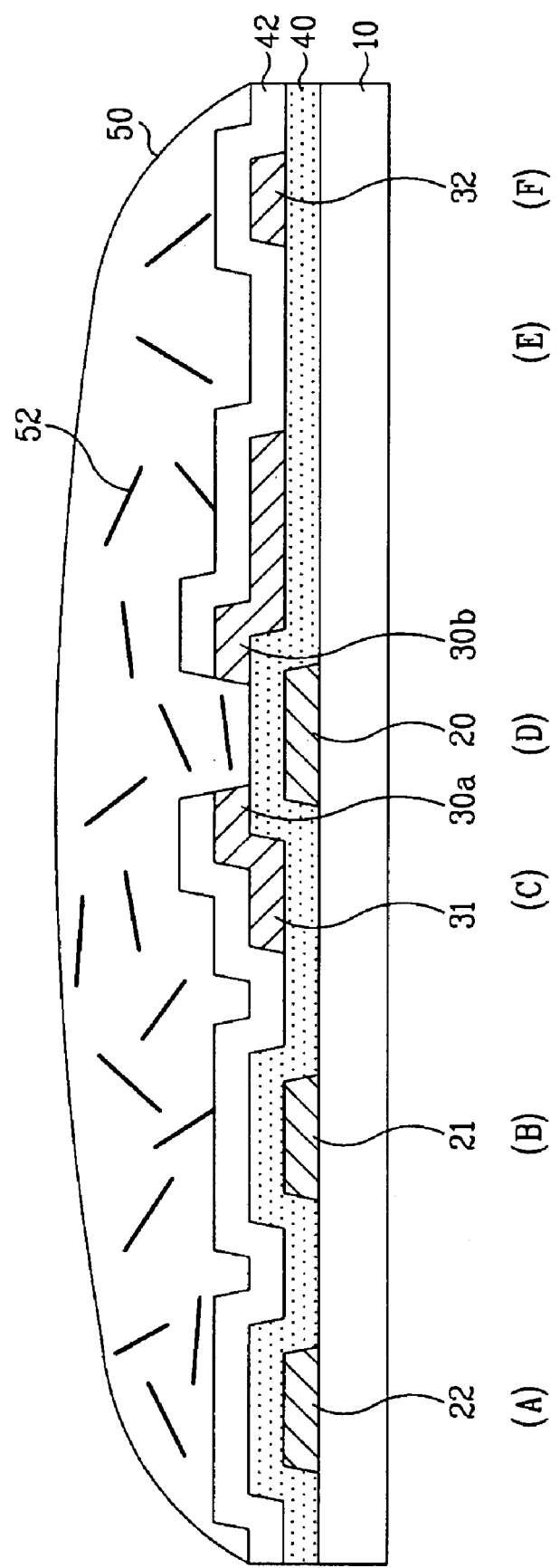

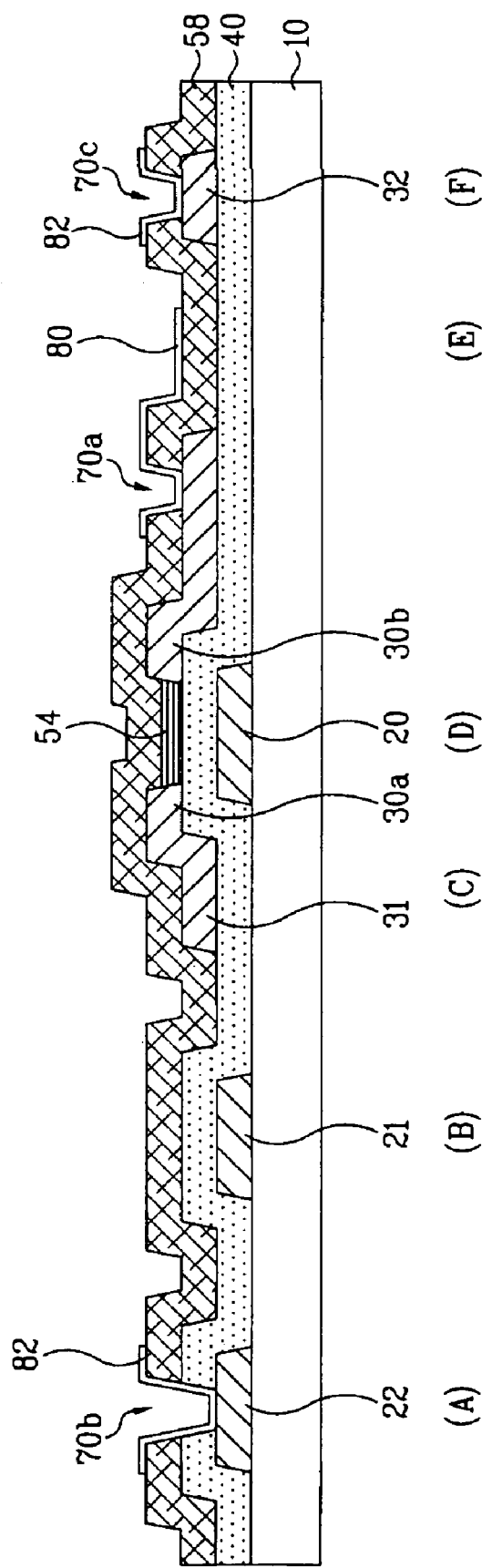

THIN FILM TRANSISTOR AND METHOD FOR FABRICATING THE SAME, AND LIQUID CRYSTAL DISPLAY DEVICE AND METHOD FOR MANUFACTURING THE SAME

This application claims the benefit of the Korean Patent Application No. 10-2007-40309, filed on Apr. 25, 2007, which is hereby incorporated by reference as if fully set forth herein.

BACKGROUND OF THE INVENTION

1. Field of the Invention

The present invention relates to a thin film transistor and a method for fabricating the same, and more particularly, to a thin film transistor fabricated using nanowires, thereby exhibiting a high mobility and a high reliability, and a method for fabricating the same.

The present invention also relates to a liquid crystal display device including a thin film transistor and a method for manufacturing the same, and more particularly, to a liquid crystal display device including a thin film transistor fabricated using nanowires, thereby exhibiting a high mobility and a high reliability, and a method for manufacturing the same.

2. Discussion of the Related Art

The recent expansion of the information society promoted development of new image display devices capable of eliminating the drawbacks of conventional cathode ray tubes (CRTs), for example, drawbacks caused by a heavy and bulky structure.

Of newly-developed image display devices, flat panel display devices, such as a liquid crystal display (LCD), an organic light emitting diode (OLED), a plasma display panel (PDP), and a surface-conduction electron-emitter display (SED), have been highlighted.

Such a flat panel display device is constituted by several ten thousand to several hundred pixels densely arranged. For a switching device to drive each pixel of the flat panel display device, a thin film transistor (TFT) is widely used.

In the past, for the TFT, an organic TFT having a semiconductor layer made of amorphous silicon was used. However, a nanowire TFT having a semiconductor layer made of nanowires has recently been-highlighted.

As used herein, the term "nanowire" generally refers to a structure made of a conductive or semiconductive material while having at least one cross-section having a height of less than 500 mm, preferably, less than 100 mm, and an aspect ratio (length:width) of 10 or more, preferably, 100 or more (WO 02/17362, WO 02/4801, and WO 01/03208).

Of such nanowires, the semiconductive nanowire may be made of a material selected from the group consisting of Si, Ge, Sn, Se, Te, B, C (including diamond), P, B—C, B—P ($BP_6$), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, $BeSiN_2$, $CaCN_2$, $ZnGeP_2$, $CdSnAs_2$, $ZnSnSb_2$, $CuGeP_3$, $CuSi_2P_3$, $Si_3N_4$, $Ge_3N_4$, $Al_2O_3$, $Al_2CO$, and an appropriate combination thereof. Of course, the material of the semiconductive nanowire is not limited to these materials.

Such a nanowire may include a carbon nanotube, or a conductive or semiconductive organic polymer material (for example, pentacene and a transition metal oxide).

When such a nanowire is used for a semiconductor layer, it is possible to implement a TFT having a mobility higher than that of the conventional TFT, which uses amorphous silicon, because the nanowire has a single crystalline structure.

In order to form a TFT using nanowires for a semiconductor layer, in conventional cases, a Langmuir-Blodgett (LB) method using a solution having a surface dispersed with nanowires is mainly used.

In accordance with the Langmuir-Blodgett method, an appropriate surface pressure is applied to the surface of the solution, to form a nanowire-dispersed layer on the surface. A substrate is dipped into the solution, which has the nanowire-dispersed surface. The dipping of the substrate is repeated, to transfer the nanowires to the solid substrate, and thus to form a nanowire layer having a single layer structure or a multi-layer structure.

However, when a nanowire semiconductor layer is formed using the Langmuir-Blodgett method, the following problems occur.

That is, the nanowires in the nanowire layer formed on the substrate should be aligned in a certain direction, in order to enable the nanowire layer to function as an effective semiconductor layer. However, it is difficult to align the nanowires in a desired direction, using the Langmuir-Blodgett method.

Also, the nanowire semiconductor layer should be selectively formed only on a channel region. However, it is difficult to selectively form the nanowire semiconductor layer only in the channel region.

FIGS. 7A and 7B illustrate a state in which nanowires are not aligned in a certain direction.

If the nanowire layer is formed in a region other than the channel region, there may be a problem in that the nanowire layer scatters light, or adversely affects the reliability of the device.

SUMMARY OF THE INVENTION

Accordingly, the present invention is directed to a thin film transistor and a method for fabricating the same, and a liquid crystal display device and a method for manufacturing the same that substantially obviate one or more problems due to limitations and disadvantages of the related art.

An object of the present invention is to provide a method for fabricating a thin film transistor, capable of selectively forming a nanowire semiconductor layer only in a channel region while aligning nanowires of the nanowire semiconductor layer in a desired direction.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a thin film transistor comprises: forming a gate electrode on a substrate; forming an insulating film on an entire surface of the substrate including the gate electrode; forming alignment electrodes on the insulating film above both sides of the gate electrode such that the alignment electrodes face each other, to define a channel region; forming an organic film, to expose the channel region; coating a nanowire-dispersed solution over the substrate; forming a nanowire semiconductor layer in the channel region by generating an electric field between the alignment electrodes; removing a solvent included in the solution; and removing the organic film.

The method may further comprise selectively forming a protective film on the nanowire semiconductor layer, after removing the organic film.

The method may further comprise selectively forming a metal layer on the alignment electrodes after removing the organic film or after the formation of the protective film.

In another aspect of, the present invention, a thin film transistor comprises a nanowire semiconductor layer selectively formed in a channel region while having nanowires aligned in one direction in the channel region.

In accordance with the thin film transistor and the thin film transistor fabricating method, it is possible to align the nanowires randomly dispersed in the nanowire-dispersed solution such that the nanowires are aligned in the channel region in parallel with an electric field formed by the alignment electrodes.

In accordance with the thin film transistor and the thin film transistor fabricating method, it is possible to selectively form the nanowire semiconductor layer only in the channel region by forming the organic film, to expose the channel region defined between the alignment electrodes, and removing the organic film after the formation of the nanowire semiconductor layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings:

FIGS. 6A to 6H are sectional views illustrating the LCD device manufacturing method according to the first embodiment of the present invention.

DETAILED DESCRIPTION OF THE INVENTION

Reference will now be made in detail to the preferred embodiments of the present invention, examples of which are illustrated in the accompanying drawings.

Hereinafter, a method for fabricating a thin film transistor (TFT) in accordance with a first embodiment of the present invention will be described with reference to the accompanying drawings.

The TFT fabricating method according to the first embodiment of the present invention comprises: forming a gate electrode on a substrate; forming an insulating film on an entire surface of the substrate including the gate electrode; forming alignment electrodes on the insulating film above both sides of the gate electrode such that the alignment electrodes face each other, to define a channel region; forming an organic film on the entire surface of the substrate including the alignment electrodes, to expose the channel region; coating a nanowire-dispersed solution over the substrate; forming a nanowire semiconductor layer in the channel region by generating an electric field between the alignment electrodes, such that nanowires of the nanowire semiconductor layer are aligned in one direction; and removing the organic film.

Hereinafter, the TFT fabricating method according to the first embodiment of the present invention will be described with reference to FIGS. 1A to 1F, namely, sectional views illustrating the TFT fabricating method, and FIGS. 2A to 2E, namely, plan views illustrating the TFT fabricating method.

Wherever possible, the same reference numbers will be used throughout the following description and the drawings to refer to the same or like parts.

Figure 1A:
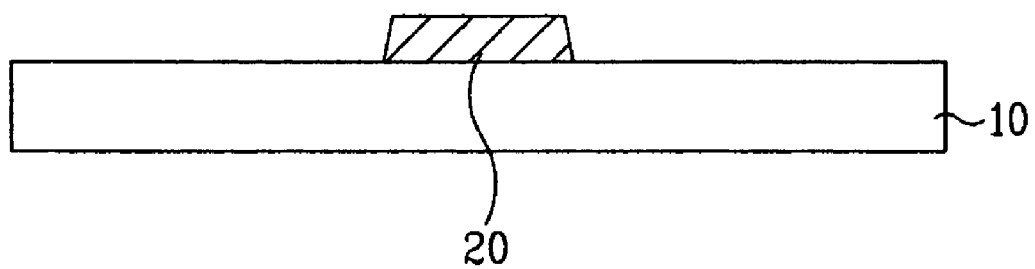
FIGS. 1A to 1F are sectional views illustrating a method for fabricating a thin film transistor according to a first embodiment of the present invention.

In accordance with the illustrated method, a gate electrode 20 is formed on a substrate 10, using a patterning process, as shown in FIG. 1A.

The gate electrode 20 is made of a conductive material such as polysilicon or metal.

Figure 1B:
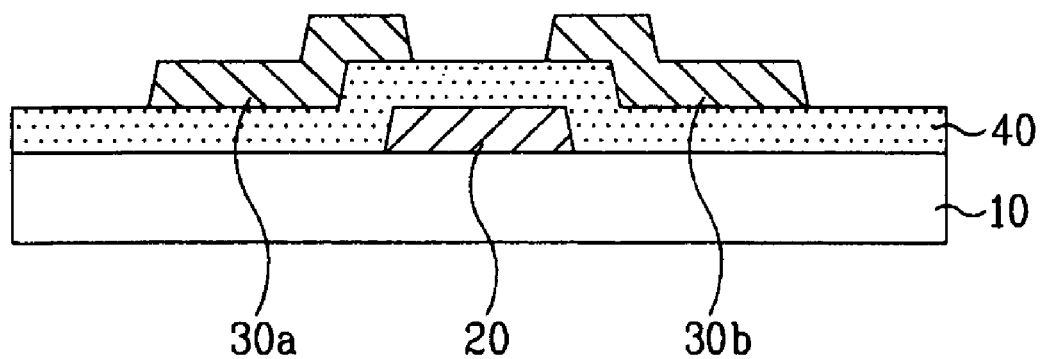
Figure 2A:
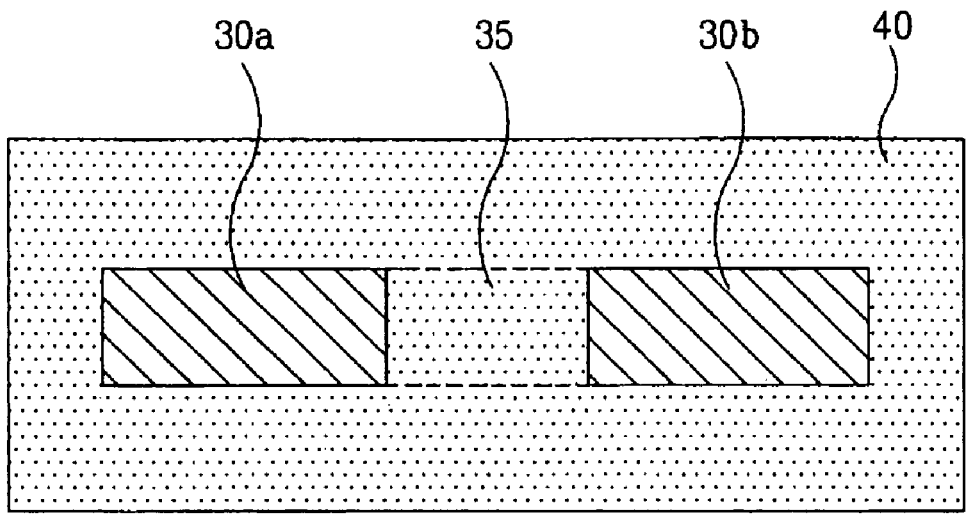
FIGS. 2A to 2E are plan views illustrating the TFT fabricating method according to the first embodiment of the present invention.

Thereafter, as shown in FIGS. 1B and 2A, an insulating film 40 is formed over the entire surface of the substrate 10 including the gate electrode 20. Alignment electrodes 30a and 30b, which define a channel region 35, are then formed on the insulating film 40 above both sides of the gate electrode 10 such that the alignment electrodes 30a and 30b face each other.

In this case, the insulating film 40 is interposed between the gate electrode 20 and the alignment electrodes 30a and 30b.

In FIGS. 1B and 2A, the illustration of lines to apply signals to the alignment electrodes 30a and 30b are omitted.

Preferably, the insulating film 40 comprises an organic insulating film made of silicon oxide ($SiO_2$) or silicon nitride ($SiN_x$). Of course, the insulating film 40 may comprise an organic insulating film made of a material selected from polyvinyl phenol (PVP), polyimide, benzocyclo butene (BCB), and parylene.

Preferably, the alignment electrodes 30a and 30b are made of a material such as copper (Cu), aluminum (Al), silver (Ag), an alloy of copper and titanium (Cu/Ti), an alloy of copper and chromium (Cu/Cr), an alloy of aluminum and titanium (Al/Ti), an alloy of aluminum and chromium (Al/Cr), an alloy of silver and titanium (Ag/Ti), or an alloy of silver and chromium (Ag/Cr). Of course, the material of the alignment electrodes 30a and 30b is not limited to the above-described materials.

Figure 1C:
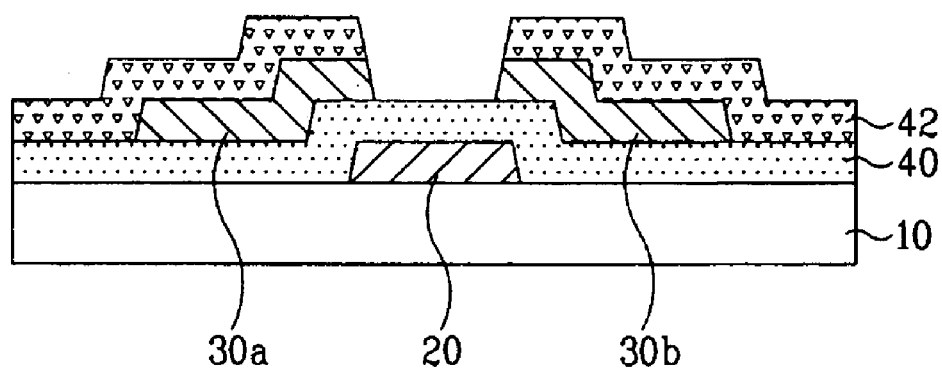
Figure 2B:
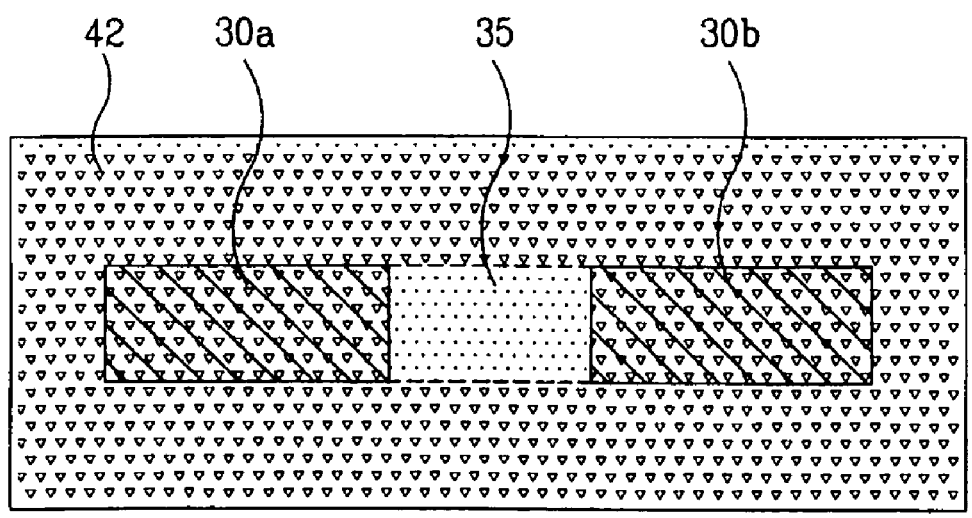

As shown in FIGS. 1C and 2B, an organic film 42 is formed on the substrate 10, to expose only the channel region 35.

The organic film 42 is formed to expose only the channel region 35 between the alignment electrodes 30a and 30b, using, for example, a photosensitive resin such as photoresist.

Figure 1D:
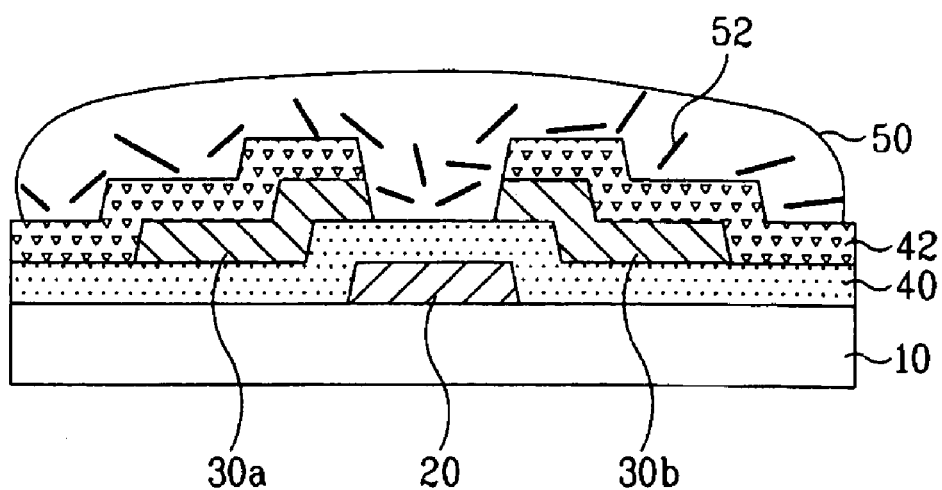
Figure 2C:
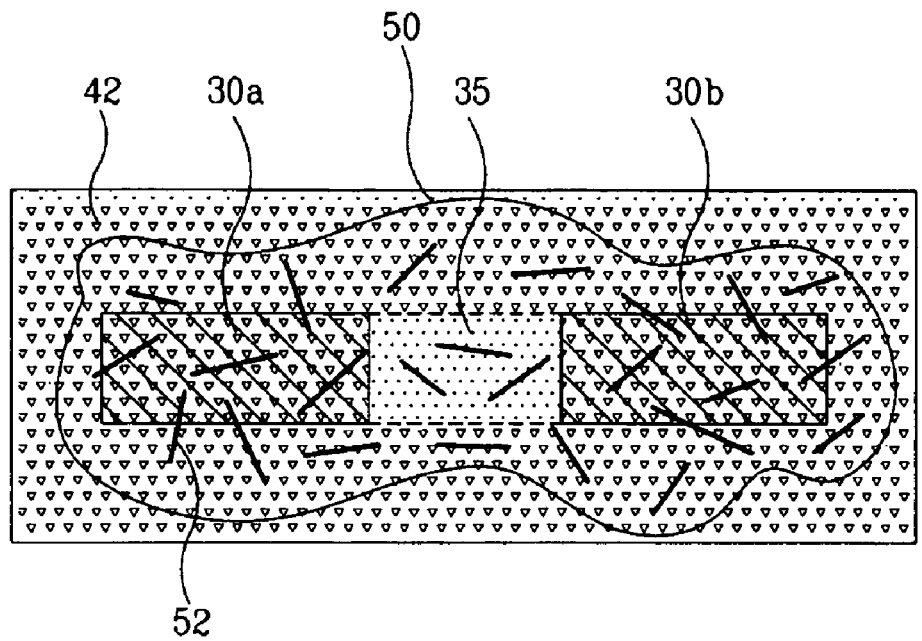

Thereafter, a nanowire-dispersed solution 50, which comprises a solvent and nanowires 52 dispersed in the solvent, is coated over the entire surface of the substrate, as shown in FIGS. 1D and 2C.

The nanowire-dispersed solution 50 may be coated by using a slit nozzle. In this case, it is possible to uniformly coat the nanowire-dispersed solution 50 over the entire surface of the substrate 10. More preferably, the nanowire-dispersed solution 50 is selectively coated in the channel region 35, using an inkjet method.

For the solvent to disperse the nanowires 52, a polar solvent such as isopropyl alcohol (IPA) or ethanol is preferred. That is, a polar solvent should be used for the nanowire-dispersing solvent because the nanowires dispersed in the solvent are aligned using an electric field.

For the nanowires, semiconductive nanowires are used.

The semiconductive nanowires are made of a Group II-VI material, a Group III-V material, a Group IV material, or a combination thereof.

The Group II-VI material may comprise an alloy of an element selected from Group-II elements such as Zn, Cd, Be, and Mg and an element selected from Group-VI elements such as Se, Te, and S. The Group II-VI material may also comprise zinc oxide or magnesium oxide.

The Group III-V material may comprise an alloy of an element selected from Group III elements such as In, Al, and Ga and an element selected from Group V elements such as As, P, and Sb.

The Group IV material may comprise Group IV elements such as Si and Ge.

Also, the semiconductive nanowires may be made of an organic semiconductive material comprising perylene, pentacene, tetracene, metalo-phthalocyanine, copper phthalocyanine, sexithiophene, or derivatives thereof. For the semiconductive nanowires, carbon nanotubes may also be used.

Figure 1E:
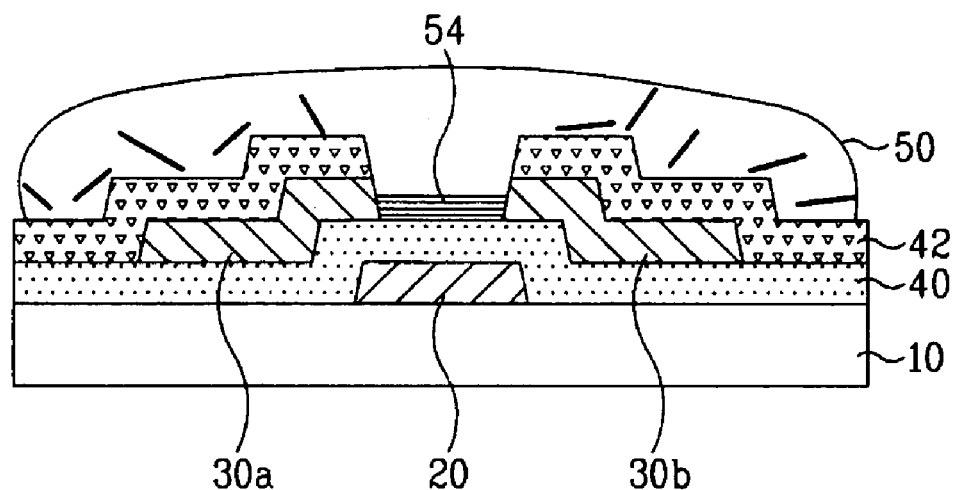
Figure 2D:
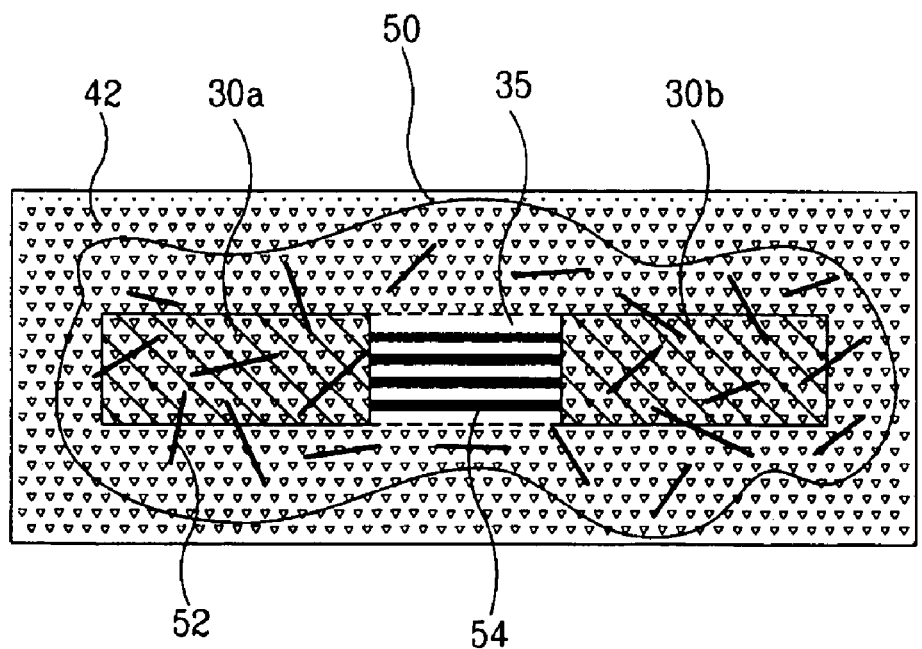

Next, as shown in FIGS. 1E and 2D, a voltage is applied between the alignment electrodes 30a and 30b, to generate an electric field between the alignment electrodes 30a and 30b.

When an electric field is generated between the alignment electrodes 30a and 30b, as described above, the nanowires are aligned to be parallel to the electric field, so that they are arranged in the channel region 35. Thus, a nanowire semiconductor layer 54 is formed.

When the nanowire semiconductor layer 54 is formed in an aligned state, the alignment thereof is maintained even when the electric field between the alignment electrodes 30a and 30b is removed.

In the structure, in which the nanowire semiconductor layer 54 is formed in the channel region 35 between the alignment electrodes 30a and 30b, the alignment electrodes 30a and 30b can function as the source and drain electrodes of the TFT, upon receiving an image signal.

The nanowires dispersed in the solution are also arranged on a portion of the organic film 42 corresponding to a region other than the channel region 35.

Figure 1F:
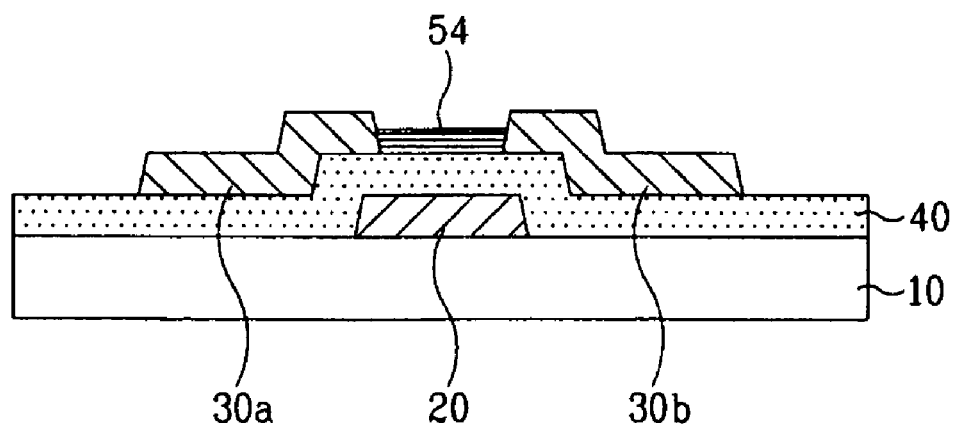
Figure 2E:
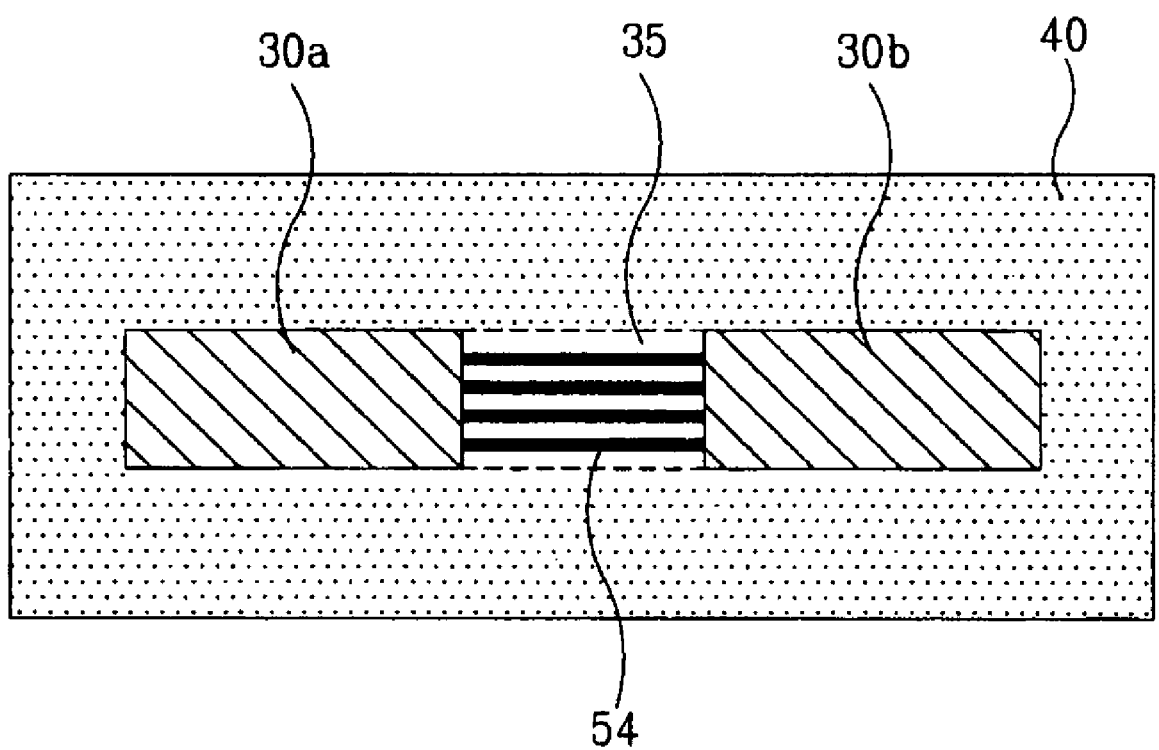

Thereafter, as shown in FIGS. 1F and 2E, the solvent of the solution on the substrate 10 is removed in accordance with a baking process. Subsequently, the organic film 42 is completely removed.

In this case, even when the electric field is removed, the aligned state of the nanowire semiconductor layer 54 arranged in the channel region 35 is not changed.

The organic film 42 may be removed by a developing solution.

In the process of removing the organic film 42, the nanowires arranged on the region other than the channel region are also removed, together with the organic film 42. Thus, it is possible to selectively form the nanowire semiconductor layer only in the channel region.

After the removal of the organic film 42, it is preferred that the substrate 10 be rinsed using dilute water (DIW), in order to avoid a failure caused by foreign matter left on the substrate 10 in a subsequent process.

As described above, in the TFT fabricating method according to the first embodiment of the present invention, it is possible to form a nanowire semiconductor layer with nanowires aligned in one direction, and to selectively form the nanowire semiconductor layer only in the channel region.

Hereinafter, a TFT fabricating method according to a second embodiment of the present invention will be described.

The TFT fabricating method according to the second embodiment of the present invention comprises: forming a gate electrode on a substrate; forming an insulating film on an entire surface of the substrate including the gate electrode; forming alignment electrodes on the insulating film above both sides of the gate electrode such that the alignment electrodes face each other, to define a channel region; forming an organic film on the entire surface of the substrate including the alignment electrodes, to expose the channel region; coating a nanowire-dispersed solution over the substrate, forming a nanowire semiconductor layer in the channel region by generating an electric field between the alignment electrodes, such that nanowires of the nanowire semiconductor layer are aligned in one direction; removing the organic film; selectively forming a protective film on the nanowire semiconductor layer; and forming a metal layer on the alignment electrodes.

Since the process of removing the organic film and all processes preceding the organic film removing process in the second embodiment are identical to those of the first embodiment, no description thereof will be given.

Figure 3A:
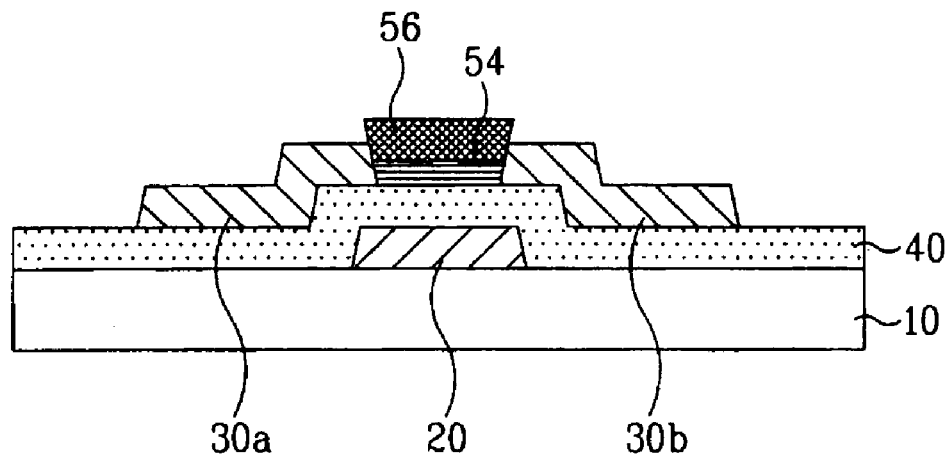
FIGS. 3A and 3B are sectional views illustrating a TFT fabricating method according to a second embodiment of the present invention.

In the TFT fabricating method according to the second embodiment of the present invention, after the selective formation of the nanowire semiconductor layer 54 on the channel region in accordance with the removal of the organic film, a protective film 56 is selectively formed on the nanowire semiconductor layer 54, as shown in FIG. 3A.

Preferably, the protective film 56 is formed by depositing an inorganic insulating material such as silicon oxide ($SiO_2$) or silicon nitride ($SiN_x$) in accordance with a plasma enhanced chemical vaporized deposition (PECVD) method or the like, and then patterning the deposited inorganic insulating material. The protective film 56 may also be formed using an organic insulating film made of polyvinyl phenol (PVP), polyimide, benzocyclo butene (BCB), parylene, or photoacryl.

Figure 3B:
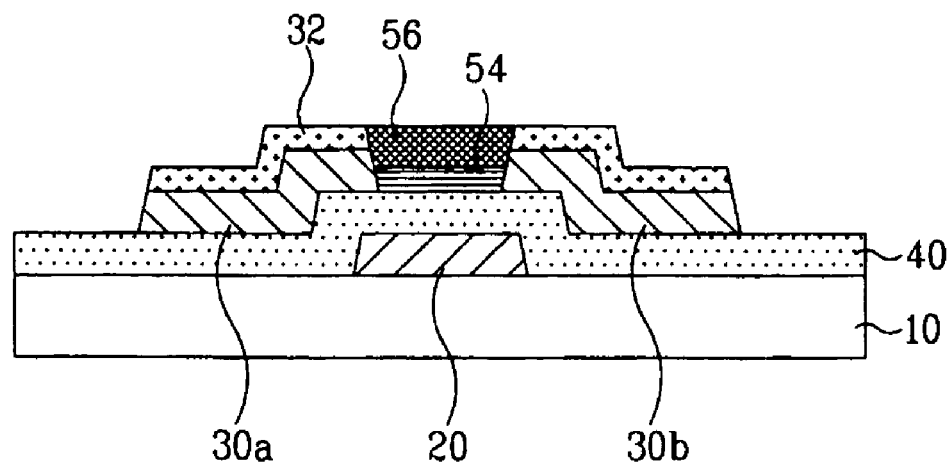

Thereafter, a metal layer 32 is selectively formed on the alignment electrodes 30a and 30b, as shown in FIG. 3B.

Thus, in the TFT fabricating method according to the second embodiment of the present invention, it is possible to form a nanowire semiconductor layer with nanowires aligned in one direction, and to selectively form the nanowire semiconductor layer only in the channel region.

In the TFT fabricating method according to the second embodiment of the present invention, the metal layer provides an effect capable of reducing the resistance of the alignment electrodes when the alignment electrodes functions as source and drain electrodes during the formation of the channel by the nanowire semiconductor layer.

The TFT fabricating method according to the second embodiment of the present invention also provides an effect capable of protecting the nanowire semiconductor layer during subsequent processes including the process of forming the metal layer.

Hereinafter, a TFT according to the first embodiment of the present invention will be described.

Figure 4:
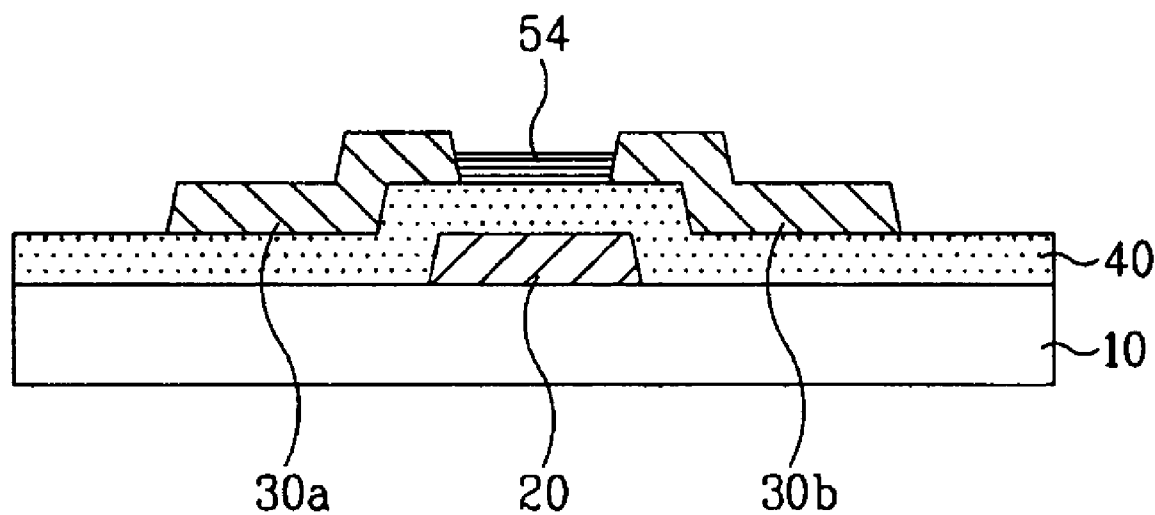
FIG. 4 is a sectional view illustrating the TFT according to the first embodiment of the present invention

FIG. 4 is a sectional view illustrating a cross-section of the TFT according to the first embodiment of the present invention.

In accordance with this embodiment, the TFT includes a gate electrode 20 formed on a substrate 10, an insulating film 40 formed over the entire surface of the substrate 10 including the gate electrode 20, alignment electrodes 30a and 30b formed on the insulating film 40 such that the alignment electrodes 30a and 30b face each other above the gate electrode 20, to define a channel region, and a nanowire semiconductor layer 54 arranged in the channel region such that nanowires of the nanowire semiconductor layer 54 are aligned in one direction. The nanowire semiconductor layer 54 is selectively formed only in the channel region.

The TFT according to this embodiment includes the nanowire semiconductor layer which is formed such that it is selectively formed only in the channel region, and nanowires thereof are aligned in one direction, using the TFT fabricating method according to the first embodiment of the present invention.

For the substrate 10, a glass substrate, a silicon substrate, or a plastic substrate may be used.

The gate electrode 20 may be made of a conductive material such as metal or polysilicon.

The insulating film may be formed, using an inorganic insulating film such as silicon oxide ($SiO_2$) or silicon nitride ($SiN_x$), or an organic insulating film made of polyvinyl phenol (PVP), polyimide, benzocyclo butene (BCB), parylene, or photoacryl.

Preferably, the alignment electrodes 30a and 30b are made of a material such as copper (Cu), aluminum (Al), silver (Ag), an alloy of copper and titanium (Cu/Ti), an alloy of copper and chromium (Cu/Cr), an alloy of aluminum and titanium (Al/Ti), an alloy of aluminum and chromium (Al/Cr), an alloy of silver and titanium (Ag/Ti), or an alloy of silver and chromium (Ag/Cr). Of course, the material of the alignment electrodes 30a and 30b is not limited to the above-described materials.

The nanowire semiconductor layer 54 is formed, using semiconductive nanowires.

The TFT may further comprise a protective film formed over the nanowire semiconductor layer 54.

The TFT may further comprise a metal layer formed on the alignment electrodes 30a and 30b.

Hereinafter, a liquid crystal display (LCD) device manufacturing method according to the first embodiment of the present invention will be described.

The LCD device manufacturing method according to the first embodiment of the present invention comprises: forming a plurality of gate lines and gate electrodes on a substrate such that each gate electrode is connected to an associated one of the gate lines, and forming gate pads on the substrate such that each gate pad is arranged at one end of an associated one of the gate lines; forming an insulating film on an entire surface of the substrate including the gate lines and the gate electrodes; forming pairs of alignment electrodes on the insulating film above both sides of each gate electrode such that the alignment electrodes of each alignment electrode pair face each other, to define a channel region, forming a plurality of data lines on the insulating film such that the data lines intersect the gate lines, to define pixel regions, and forming data pads on the insulating film such that each data pad is arranged at one end of an associated one of the data lines; forming an organic film on the entire surface of the substrate including the alignment electrode pairs and the data lines, to expose the channel region defined by each alignment electrode pair; coating a nanowire-dispersed solution over the entire surface of the substrate including the organic film; generating an electric field between the alignment electrodes of each alignment electrode pair, to form a nanowire semiconductor layer in the channel region defined by each alignment electrode pair such that nanowires of the nanowire semiconductor layer are aligned in one direction; removing a solvent included in the nanowire-dispersed solution; removing the organic film; forming a passivation film over the entire surface of the substrate including the alignment electrode pairs and the nanowire semiconductor layer; selectively removing the passivation film, to form contact holes such that each alignment electrode pair is partially exposed through an associated one of the contact holes; and forming pixel electrodes such that the pixel electrodes are connected to the alignment electrode pairs via the contact holes, respectively.

Figure 5:
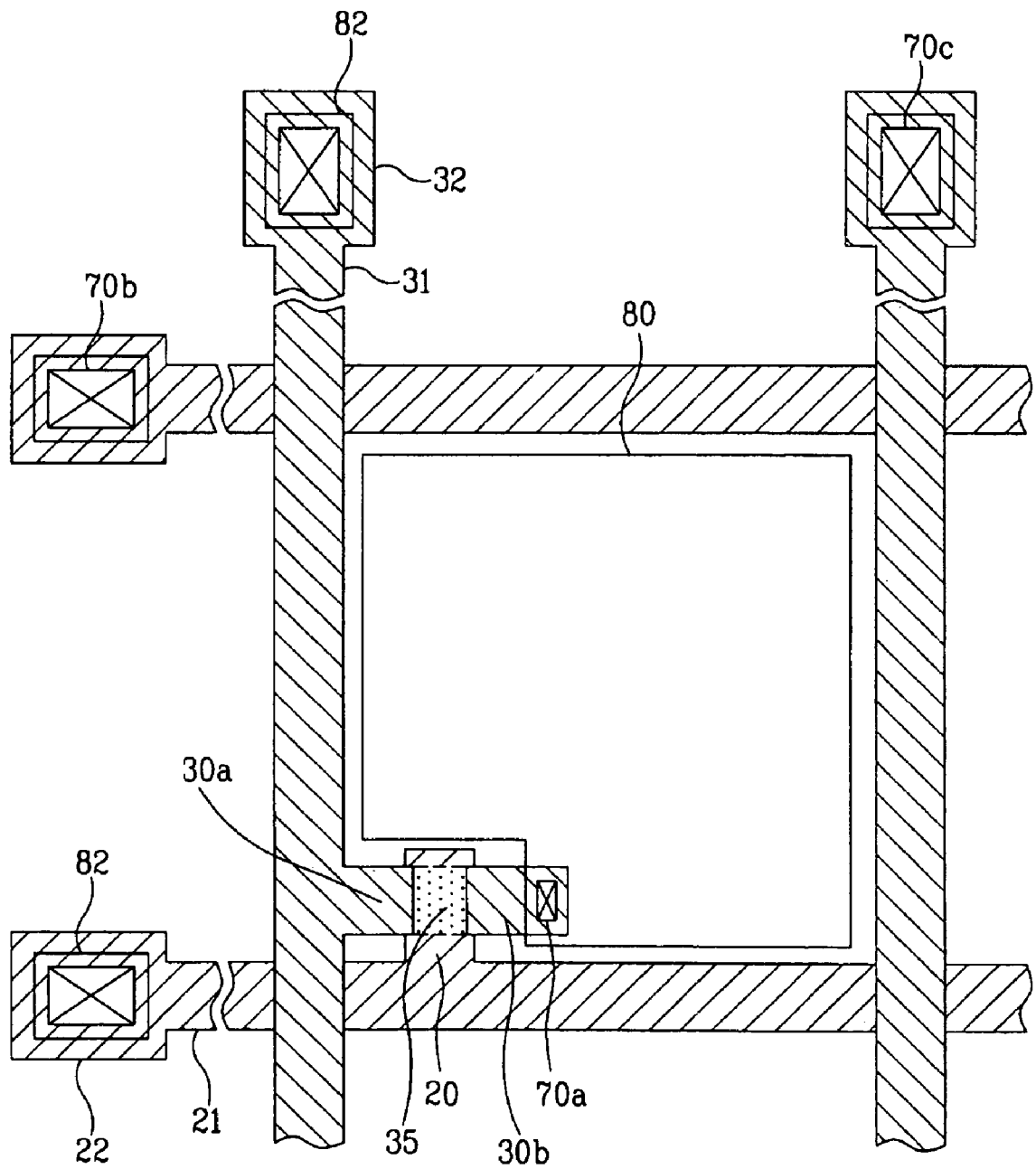
FIG. 5 is a plan view schematically illustrating a liquid crystal display (LCD) device manufactured by an LCD device manufacturing method according to the first embodiment of the present invention.

FIG. 5 is a plan view schematically illustrating an LCD device according to the first embodiment of the present invention. FIGS. 6A to 6H are sectional views illustrating an LCD device manufacturing method according to the first embodiment of the present invention. In FIGS. 6A to 6H, a gate pad section A, a gate line section B, a data line section C, a TFT section D, a pixel electrode section E, and a data pad section F are shown, in this order, starting from the left side. Although the LCD device has a plurality of pixel regions defined by a plurality of gate lines and a plurality of data lines, and includes a plurality of TFTs corresponding to respective pixel regions, the following description will be given only in conjunction with one pixel region and one TFT, for the simplicity of description.

Figure 6A:
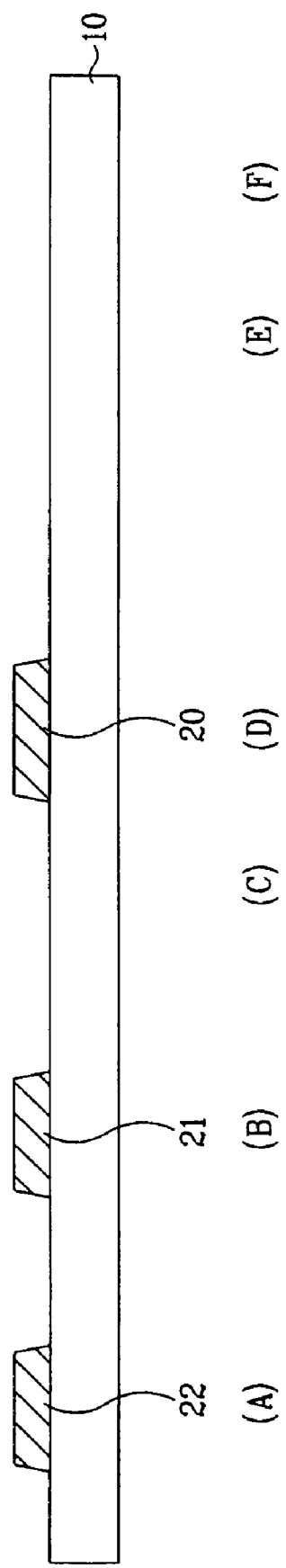

In accordance with the illustrated method, a gate line 21 is formed on a substrate 10, as shown in FIG. 6A. A gate pad 22 is also formed on the substrate 10 such that it is arranged at one end of the gate line 21. Also, a gate electrode 20 is formed on the substrate 10 such that it is connected to the gate line 21. The formation of the gate line 21, gate pad 22, and gate electrode 20 is achieved by forming a conductive material over the substrate 10, and patterning the conductive material.

The gate line 21, gate pad 22, and gate electrode 20 are made of a conductive material such as polysilicon or metal.

For the substrate 10, a substrate made of a glass material or a substrate made of a plastic material such as poly ethylene terephthalate (PET), polyimide, or epoxy resin may be used.

Figure 6B:
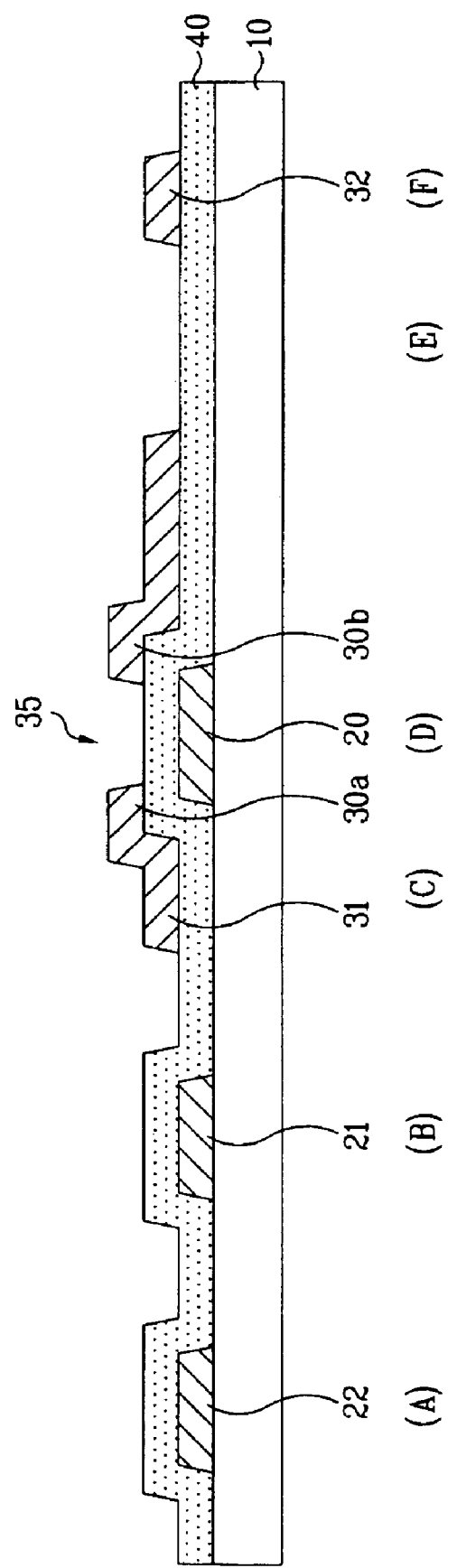

Thereafter, as shown in FIG. 6B, an insulating film 40 is formed over the entire surface of the substrate 10 including the gate line 21, gate pad 22, and gate electrode 20. A data line 31, a data pad 32, and a pair of alignment electrodes, namely, alignment electrodes 30a and 30b, are then formed on the insulating film 40, using a patterning process.

The data line 31 is formed such that it intersects the gate line 21, to define a pixel region. The data pad 32 is arranged at one end of the data line 31.

One of a pair of alignment electrodes 30a and 30b is connected to the data line 31. The alignment electrodes 30a and 30b are arranged above both sides of the gate electrode 20 such that they face each other, to define a channel region 35.

Preferably, the insulating film 40 comprises an organic insulating film made of silicon oxide ($SiO_2$) or silicon nitride ($SiN_x$). Of course, the insulating film 40 may comprise an organic insulating film made of polyvinyl phenol (PVP), polyimide, benzocyclo butene (BCB), parylene, or photoacryl.

The inorganic insulating film may be formed using a PECVD process. The organic insulating film may be formed by coating a liquid-phase organic material.

Preferably, the data line 31, data pad 32, and alignment electrodes 30a and 30b are made of a material such as copper (Cu), aluminum (Al), silver (Ag), an alloy of copper and titanium (Cu/Ti), an alloy of copper and chromium (Cu/Cr), an alloy of aluminum and titanium (Al/Ti), an alloy of aluminum and chromium (Al/Cr), an alloy of silver and titanium (Ag/Ti), or an alloy of silver and chromium (Ag/Cr). Of course, the material of the data line 31, data pad 32, and alignment electrodes 30a and 30b is not limited to the above-described materials.

As shown in FIG. 6C, an organic film 42 is then formed on the entire surface of the substrate 10, to expose only the channel region 35.

The organic film 42 is formed to expose only the channel region 35 between the alignment electrodes 30a and 30b, using, for example, a photosensitive resin such as photoresist.

Thereafter, a nanowire-dispersed solution 50, which comprises a solvent and nanowires 52 dispersed in the solvent, is coated over the entire surface of the substrate, as shown in FIG. 6D.

The nanowire-dispersed solution 50 may be coated using a slit nozzle. In this case, it is possible to uniformly coat the nanowire-dispersed solution 50 over the entire surface of the substrate 10. More preferably, the nanowire-dispersed solution 50 is selectively coated in the channel region 35, using an inkjet method.

For the solvent to disperse the nanowires 52, a polar solvent such as isopropyl alcohol (IPA) or ethanol is preferred. That is, a polar solvent should be used for the nanowire-dispersing solvent because the nanowires dispersed in the solvent are aligned using an electric field.

For the nanowires, semiconductive nanowires are used.

Figure 6E:
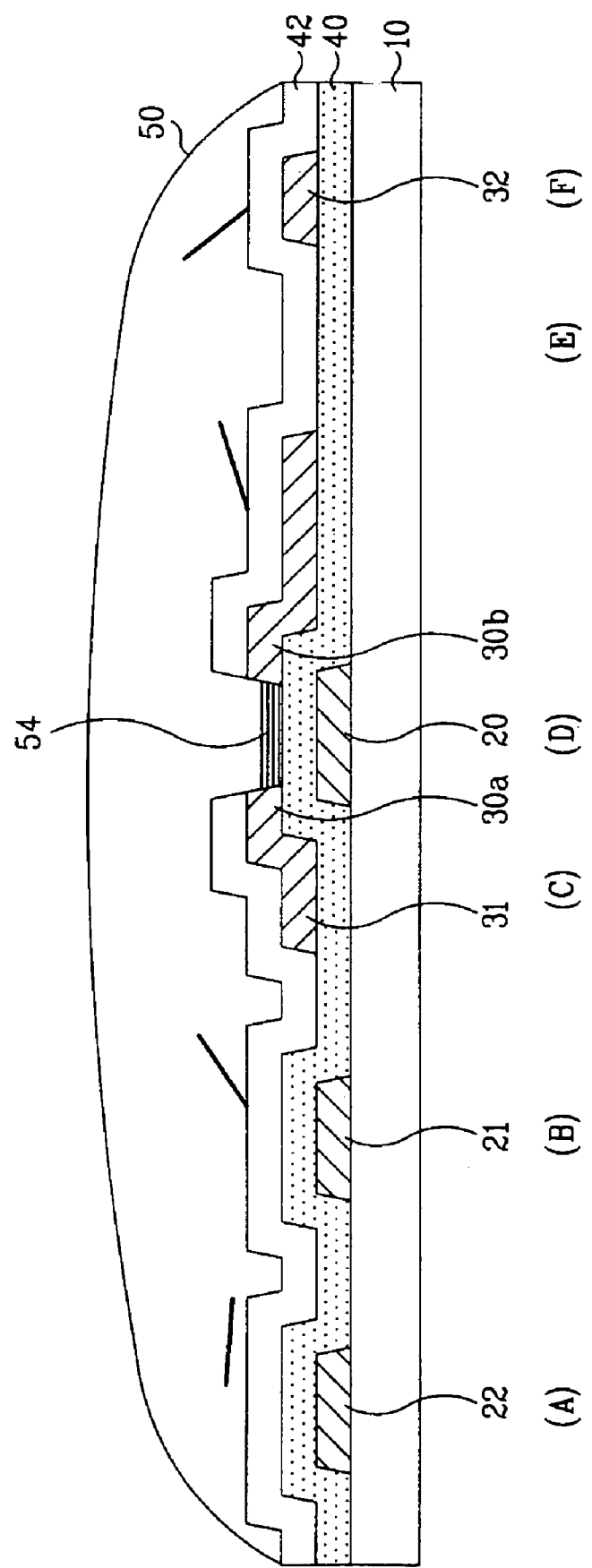

Next, as shown in FIG. 6E, an electric field is generated between the alignment electrodes 30a and 30b, to form a nanowire semiconductor layer 54 in the channel region 35.

Figure 6F:
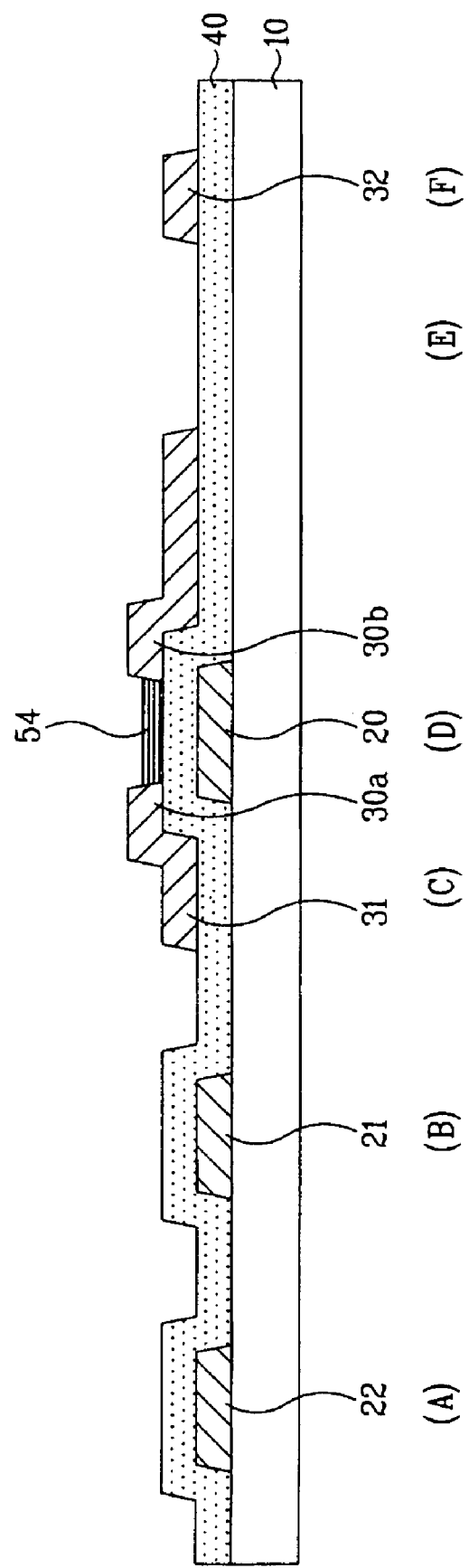

Thereafter, as shown in FIG. 6F, the solvent is removed. The organic film 42 is subsequently removed using a stripper.

As the organic film 42 is removed, the nanowires arranged on the region other than the channel region are removed, together with the organic film 42. Thus, it is possible to selectively form the nanowire semiconductor layer only in the channel region.

Figure 6G:
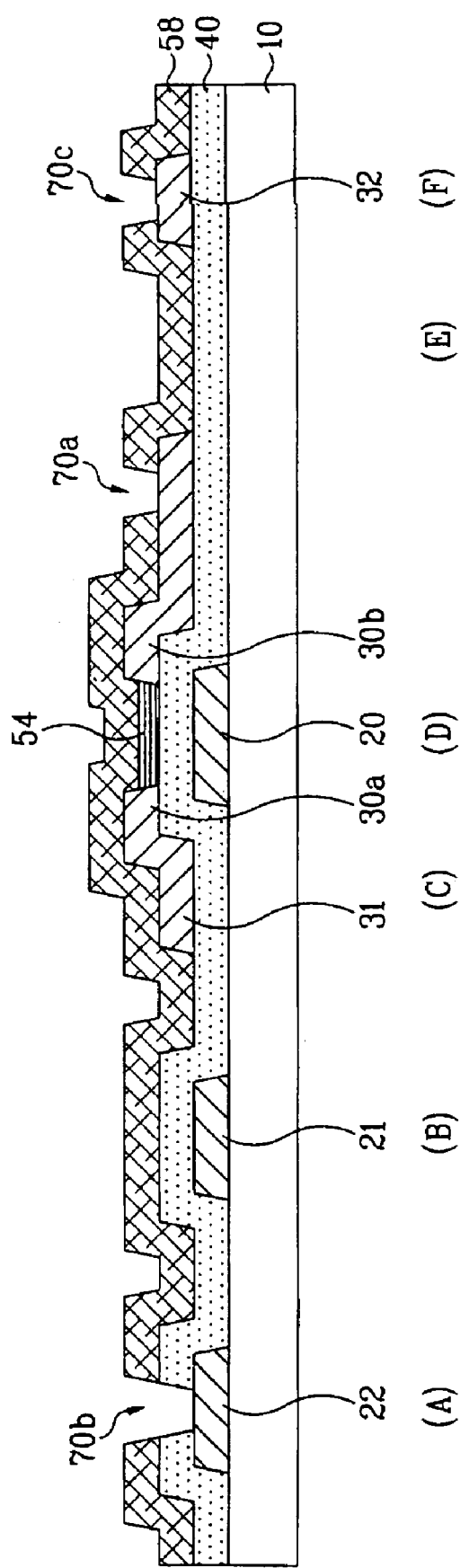
Figure 7A:
FIGS. 7A and 7B are photographs showing problems incurred in conventional cases.
Figure 7B:

Thereafter, as shown in FIG. 6G, a passivation film 58 is formed over the entire surface of the substrate including the nanowire semiconductor layer 54, data line 31, data pad 32, and alignment electrodes 30a and 30b. The passivation film 58 is then selectively removed, to form a first contact hole 70a to partially expose one of the alignment electrode pair, which includes the alignment electrodes 30a and 30b, a second contact hole 70b to expose the gate pad 22, and a third contact hole 70c to expose the data pad 32.

The passivation film 58 may be formed by depositing an inorganic material such as silicon oxide ($SiO_2$) or silicon nitride ($SiN_x$). The passivation film 58 may also be formed using an organic insulating film made of polyvinyl phenol (PVP), polyimide, benzocyclo butene (BCB), parylene, or photoacryl.

The first to third contact holes 70a, 70b, and 70c may be formed in accordance with a photolithography method using a dry etching process.

Thereafter, a pixel electrode 80 is formed on the pixel region to contact to one of the alignment electrode pair through the first contact hole 70a, as shown in FIG. 6H. Pad electrodes 82 are also formed such that they cover the second and third contact holes 70b and 70c, respectively.

The pixel electrode 80 is electrically connected to one of the alignment electrodes 30a and 30b via the first contact hole 70a. Accordingly, the pixel electrode 80 receives a pixel voltage via the nanowire semiconductor layer 54, thereby driving liquid crystals.

The pad electrodes 82 receive external signals via the second and third contact holes 70b and 70c, respectively.

Preferably, the pixel electrode 80 is made of a transparent conductive material such as indium tin oxide (ITO) or indium zinc oxide (IZO).

After the removal of the organic film 42, it is preferred that the substrate 10 be rinsed using dilute water (DIW), in order to avoid a failure caused by foreign matter left on the substrate 10 in a subsequent process.

Using dilute water, it is possible to rinse the nanowire semiconductor layer and other patterns formed on the substrate, without any chemical affect.

Thus, in the LCD device manufacturing method according to the first embodiment of the present invention, it is possible to reduce the area of the channel region, and thus to secure a high aperture ratio and to shorten the response time, because the LCD device manufactured by the manufacturing method includes a TFT including a nanowire semiconductor layer formed such that nanowires are aligned in one direction, to exhibit a high mobility.

In the LCD device manufacturing method according to the first embodiment of the present invention, it is also possible to form the nanowire semiconductor layer only in the channel region, and thus to avoid a degradation in display quality caused by scattering of light due to nanowires arranged in the pixel region.

In the LCD device manufacturing method according to the first embodiment of the present invention, the semiconductor layer is formed in a solution-base manner, using the nanowire-dispersed solution. Accordingly, it is possible to simplify the entire process.

Hereinafter, an LCD device manufacturing method according to the second embodiment of the present invention will be described.

The LCD device manufacturing method according to the second embodiment of the present invention comprises: forming a plurality of gate lines and gate electrodes on a substrate such that each gate electrode is connected to an associated one of the gate lines; forming an insulating film over an entire surface of the substrate including the gate lines and the gate electrodes; forming pairs of alignment electrodes on the insulating film above both sides of the gate electrode, respectively, such that the alignment electrodes of each alignment electrode pair face each other, to define a channel region, and forming a plurality of data lines on the insulating film such that the data lines intersect the gate lines, to define pixel regions; forming an organic film on the entire surface of the substrate including the alignment electrode pairs and the data lines, to expose only the channel region defined by each alignment electrode pair; coating a nanowire-dispersed solution over the entire surface of the substrate including the organic film; generating an electric field between the alignment electrodes of each alignment electrode pair, to form a nanowire semiconductor layer in the channel region defined by each alignment electrode pair such that nanowires of the nanowire semiconductor layer are aligned in one direction; removing a solvent included in the nanowire-dispersed solution; removing the organic film; selectively forming a protective film on the nanowire semiconductor layer; selectively forming a metal layer on the alignment electrodes; forming a passivation film over the entire surface of the substrate including the protective film and the metal layer; selectively removing the passivation film, to form contact holes partially exposing the metal layer; and forming pixel electrodes such that each pixel electrode is connected to the metal layer via an associated one of the contact holes.

Since the process of removing the organic film and all processes preceding the organic film removing process in the second embodiment are identical to those of the first embodiment, no description thereof will be given.

The LCD manufacturing method according to the second embodiment of the present invention further comprises selectively forming a protective film on the nanowire semiconductor layer, and selectively forming a metal layer on the alignment electrodes.

Since the metal layer is formed on the alignment electrodes, the metal layer is partially exposed through the contact holes. Accordingly, each pixel electrode is electrically connected to the metal layer.

Preferably, the protective film is formed by depositing an inorganic insulating material such as silicon oxide ($SiO_2$) or silicon nitride ($SiN_x$) in accordance with a plasma enhanced chemical vaporized deposition (PECVD) method or the like, and then patterning the deposited inorganic insulating material. The protective film may also be formed using an organic insulating film made of polyvinyl phenol (PVP), polyimide, benzocyclo butene (BCB), parylene, or photoacryl.

Preferably, the protective film is made of a material having a different etch selectivity from the passivation film.

Thus, the LCD device manufactured by the LCD device manufacturing method according to the second embodiment of the present invention includes a nanowire semiconductor layer selectively formed in the channel region of each TFT while having nanowires aligned in one direction, a protective film selectively formed on the nanowire semiconductor layer, and a metal layer selectively formed on the alignment electrodes.

Accordingly, the metal layer reduces the resistance of the alignment electrodes when the alignment electrodes functions as source and drain electrodes during the formation of a channel by the nanowire semiconductor layer.

In the LCD device manufacturing method according to the second embodiment of the present invention, the protective film can protect the nanowire semiconductor layer in subsequent processes including the metal layer forming process.

Hereinafter, an LCD device according to the first embodiment of the present invention will be described.

The LCD device according to the first embodiment of the present invention comprises: a plurality of gate lines formed on a substrate, gate electrodes formed on the substrate such that each gate electrode is connected to an associated one of the gate lines, and gate pads formed on the substrate such that each gate pad is arranged at one end of an associated one of the gate lines; an insulating film formed over the entire surface of the substrate including the gate lines and the gate electrodes; pairs of alignment electrodes formed on the insulating film above the gate electrodes, respectively, such that the alignment electrodes of each alignment electrode pair face each other, to define a channel region, a plurality of data lines formed on the insulating film such that the data lines intersect the gate lines, to define pixel regions, and data pads formed on the insulating film such that each data pad is arranged at one end of an associated one of the data lines; a nanowire semiconductor layer formed in the channel region defined by each alignment electrode pair such that nanowires of the nanowire semiconductor layer are aligned in one direction, the nanowire semiconductor layer being connected to the alignment electrode pair; a passivation film formed over the entire surface of the substrate including the alignment electrode pairs and the nanowire semiconductor layer; a plurality of contact holes formed by selective removal of the passivation film, to partially expose the alignment electrode pairs, the gate pads, and the data pads; and pixel electrodes respectively connected to the alignment electrode pairs via associated ones of the contact holes; and pad electrodes respectively connected to the gate pads and the data pads via associated ones of the contact holes.

For the substrate, a substrate made of a glass material or a substrate made of a plastic material such as poly ethylene terephthalate (PET), polyimide, or epoxy resin may be used, in order to implement a flexible display.

The gate lines and gate electrodes may be made of a conductive material, for example, polysilicon, metal such as Al, Cu, Cr, Mo, Al/Nd, Mo/Al/Mo, or Cr/Al/Mo, or an alloy of such metals.

For the insulating film, an organic insulating film made of silicon oxide ($SiO_2$) or silicon nitride ($SiN_x$), or an organic insulating film made of polyvinyl phenol (PVP), polyimide, benzocyclo butene (BCB), parylene, or photoacryl may be used.

Preferably, the alignment electrodes are made of a material such as copper (Cu), aluminum (Al), silver (Ag), an alloy of copper and titanium (Cu/Ti), an alloy of copper and chromium (Cu/Cr), an alloy of aluminum and titanium (Al/Ti), an alloy of aluminum and chromium (Al/Cr), an alloy of silver and titanium (Ag/Ti), or an alloy of silver and chromium (Ag/Cr). Of course, the material of the alignment electrodes is not limited to the above-described materials.

The data lines may be formed using the same material as the alignment electrodes. Of course, the data lines may be made of a metal different from the material of the alignment electrodes, as long as the data lines are electrically connected to the alignment electrodes, using the metal.

The nanowire semiconductor layer is made of semiconductive nanowires.

The passivation film is formed over the entire surface of the substrate including the alignment electrodes and nanowire semiconductor layer, using an inorganic insulating material or an organic insulating material.

The passivation film is selectively removed to form contact holes each partially exposing the associated alignment electrode pair.

The pixel electrodes are formed such that each pixel electrode is connected to the associated alignment electrode pair via the associated contact hole. The pixel electrodes are made of a transparent material such as ITO or IZO.

The alignment electrodes of each alignment electrode pair receive an image signal via the associated data line, and supply the received image signal to the associated pixel electrode, to enable the pixel electrode to drive liquid crystals.

Hereinafter, an LCD device according to the second embodiment of the present invention will be described.

The LCD device according to the second embodiment of the present invention comprises: a plurality of gate lines formed on a substrate, and gate electrodes formed on the substrate such that each gate electrode is connected to an associated one of the gate lines; an insulating film formed over an entire surface of the substrate including the gate lines and the gate electrodes; pairs of alignment electrodes formed on the insulating film above both sides of the gate electrodes, respectively, such that the alignment electrodes of each alignment electrode pair face each other, to define a channel region, and a plurality of data lines formed on the insulating film such that the data lines intersect the gate lines, to define pixel regions; a nanowire semiconductor layer formed in the channel region defined by each alignment electrode pair such that nanowires of the nanowire semiconductor layer are aligned in one direction, the nanowire semiconductor layer being connected to the alignment electrode pair; a protective film selectively formed on the nanowire semiconductor layer;

a metal layer selectively formed on the alignment electrode pairs; a passivation film formed over the entire surface of the substrate including the metal layer and the protective film; contact holes formed by selective removal of the passivation film, to partially expose the metal layer; and pixel electrodes formed such that each pixel electrode is connected to the metal layer via an associated one of the contact holes.

The LCD device according to the second embodiment of the present invention has the same configuration as that of the first embodiment, except that the LCD device of the second embodiment further comprises the protective film and metal layer. Therefore, no description will be given of the configurations other than the protective film and metal layer.

The protective film may be formed using an inorganic insulating material such as silicon oxide ($SiO_2$) or silicon nitride ($SiN_x$), or an organic insulating film made of polyvinyl phenol (PVP), polyimide, benzocyclo butene (BCB), parylene, or photoacryl, in order to protect the nanowire semiconductor layer in subsequent processes.

The metal layer is selectively formed on each alignment electrode pair, to reduce the resistance of the alignment electrode pair when an image signal is supplied to the associated pixel electrode via the alignment electrode pair, and thus to enhance the display quality.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

As apparent from the above description, in the LCD device manufacturing method according to the present invention, it is possible to selective form a nanowire semiconductor layer in a channel region such that nanowires of the nanowire semiconductor layer are aligned in one direction. Accordingly, it is possible to implement a nanowire TFT having a high mobility and a high reliability.

In accordance with the formation of the nanowire semiconductor layer, which has a high mobility, it is possible to reduce the area of the channel region. Accordingly, an LCD device having a high aperture ratio and a short response time can be implemented.

Using the TFT, which includes the nanowire semiconductor layer having a high mobility, it is also possible to implement an LCD device having a chip-on-glass (COG) structure.

Since the nanowire semiconductor layer can be formed in a solution-base manner, it is possible to reduce the number of processes including vacuum processes and patterning processes, and thus to simplify the overall process.

What is claimed is:

1. A method for fabricating a thin film transistor, comprising:
    forming a gate electrode on a substrate;
    forming an insulating film on an entire surface of the substrate including the gate electrode;
    forming alignment electrodes on the insulating film such that the alignment electrodes face each other, to define a channel region;
    forming an organic film on the insulting film including the alignment electrodes, to expose the channel region;
    coating a nanowire-dispersed solution over the substrate and the organic film;
    forming a nanowire semiconductor layer in the channel region by generating an electric field between the alignment electrodes;
    removing a solvent included in the solution; and
    removing the organic film.

2. The method according to claim 1, further comprising:
    forming a protective film on the nanowire semiconductor layer, after removing the organic film; and
    forming a metal layer on the alignment electrodes.

3. The method according to claim 1, further comprising:
    forming a metal layer on the alignment electrodes, after removing the organic film.

4. The method according to claim 1, wherein the nanowire-dispersed solution is coated over the substrate by using a polar solvent as the solvent of the nanowire-dispersed solution.

5. The method according to claim 1, wherein the organic film is removed by a developing solution.

6. The method according to claim 1, further comprising:
    rinsing the substrate with a dilute water after removing the organic film.

7. The method according to claim 1, wherein the nanowire-dispersed solution is coated over an entire surface of the substrate, using a slit nozzle.

8. The method according to claim 1, wherein the nanowire-dispersed solution is selectively coated on the channel region, using an inkjet process.

9. The method according to claim 1, wherein nanowires of the nanowire semiconductor layer are aligned in one direction.

* * * * *